US008543885B2

(12) United States Patent
Lee et al.

(10) Patent No.: US 8,543,885 B2
(45) Date of Patent: Sep. 24, 2013

(54) METHODS OF JOINT CODING IN MOBILE COMMUNICATION SYSTEM

(75) Inventors: Dae Won Lee, Gyeonggi-do (KR); Dong Wook Roh, Gyeonggi-do (KR); Bong Hoe Kim, Gyeonggi-do (KR); Nam Yul Yu, Gyeonggi-do (KR); Ki Jun Kim, Gyeonggi-do (KR)

(73) Assignee: LG Electronics Inc., Seoul (KR)

( * ) Notice: Subject to any disclaimer, the term of this patent is extended or adjusted under 35 U.S.C. 154(b) by 664 days.

(21) Appl. No.: 12/670,100

(22) PCT Filed: Nov. 13, 2008

(86) PCT No.: PCT/KR2008/006693
§ 371 (c)(1),
(2), (4) Date: Jun. 28, 2010

(87) PCT Pub. No.: WO2009/064122
PCT Pub. Date: May 22, 2009

(65) Prior Publication Data
US 2010/0272209 A1  Oct. 28, 2010

Related U.S. Application Data

(60) Provisional application No. 60/988,809, filed on Nov. 18, 2007.

(30) Foreign Application Priority Data

Aug. 5, 2008  (KR) .................. 10-2008-0076473

(51) Int. Cl.
*H03M 13/35* (2006.01)
(52) U.S. Cl.
USPC ....................................................... 714/755

(58) Field of Classification Search
USPC ............................................................ 714/755
See application file for complete search history.

(56) References Cited

U.S. PATENT DOCUMENTS

| | | | |
|---|---|---|---|
| 6,813,506 B1 * | 11/2004 | Song ............................. | 455/466 |
| 7,499,474 B2 * | 3/2009 | Derryberry et al. .......... | 370/538 |
| 7,721,179 B2 * | 5/2010 | Kim et al. ..................... | 714/755 |
| 8,078,932 B2 * | 12/2011 | Zeira et al. .................... | 714/752 |

FOREIGN PATENT DOCUMENTS

| | | |
|---|---|---|
| KR | 10-2002-0031554 | 5/2002 |
| KR | 10-2002-0075148 | 10/2002 |

OTHER PUBLICATIONS

Kumar, et al., "On Unequal Error Protection LDPC Codes Based on Plotkin-type Constructions", IEEE Globecomm 2004, pp. 493-497.*
Qualcomm Europe, "Proposed Structure for UL ACK and CQI," 3GPP TSG RAN1 #47-bis, Jan. 2007, R1-070437.
Qualcomm Europe, "Joint Coding of CQI and ACK," 3GPP TSG RAN WG1 #50, Aug. 2007, R1-073260.

* cited by examiner

*Primary Examiner* — Stephen M Baker
(74) *Attorney, Agent, or Firm* — Lee, Hong, Degerman, Kang & Waimey

(57) ABSTRACT

A joint coding method in a mobile communication system is disclosed. To block-code k$\chi$-bit first data requiring a received signal quality and k2~bit second data requiring a different received signal quality, the present invention includes configuring a first block code generation matrix meeting a first minimum hamming distance, configuring a second block code generation matrix meeting a second minimum hamming distance, and configuring a third block code generation matrix including the first block code generation matrix, the second block code generation matrix and a zero matrix of a specific size. Accordingly, the present invention encodes and transmits two data requiring different received signal qualities by one coding scheme, thereby enabling each data to have the required received signal quality in decoding.

6 Claims, 15 Drawing Sheets

⌐ ⌐ ⌐ : 8 bases of $C_{1,1}$

┌─ ─┐ : 10 bases of $C_1$ $$
\begin{aligned}
u[1] &:= [0, 0, 0, 0, 0, 0, 0, 1, 1, 1, 1, 1, 1, 1, 1 \,|\, 0, 0, 0, 0, 0] \\
u[2] &:= [0, 0, 0, 1, 1, 1, 1, 0, 0, 0, 0, 1, 1, 1, 1 \,|\, 0, 0, 0, 0, 0] \\
u[3] &:= [0, 1, 1, 0, 0, 1, 1, 0, 0, 1, 1, 0, 0, 1, 1 \,|\, 0, 0, 0, 0, 0] \\
u[4] &:= [1, 0, 1, 0, 1, 0, 1, 0, 1, 0, 1, 0, 1, 0, 1 \,|\, 0, 0, 0, 0, 0] \\
u[5] &:= [0, 0, 0, 0, 0, 0, 0, 0, 0, 1, 1, 0, 0, 1, 1 \,|\, 0, 0, 0, 0, 0] \\
u[6] &:= [0, 0, 0, 0, 0, 0, 0, 1, 0, 1, 0, 1, 0, 1 \,|\, 0, 0, 0, 0, 0] \\
u[7] &:= [0, 0, 0, 0, 0, 1, 1, 0, 0, 0, 0, 0, 0, 1, 1 \,|\, 0, 0, 0, 0, 0] \\
u[8] &:= [0, 0, 0, 0, 1, 0, 1, 0, 0, 0, 0, 0, 1, 0, 1 \,|\, 0, 0, 0, 0, 0] \\
u[9] &:= [0, 0, 0, 0, 0, 0, 0, 0, 0, 0, 0, 1, 1, 1, 1 \,|\, 1, 0, 1, 0, 1] \\
u[10] &:= [0, 0, 1, 0, 0, 0, 1, 0, 0, 0, 1, 0, 0, 0, 1 \,|\, 0, 1, 1, 1, 1]
\end{aligned}
$$

: 10 bases of $C_1$

: 2 bases of $C_2$

FIG. 9 e[1] := [0, 0, 0, 0, 0, 0, 0, 1, 1, 1, 1, 1, 1, 1, 1]
e[2] := [0, 0, 0, 1, 1, 1, 1, 0, 0, 0, 0, 1, 1, 1, 1]
e[3] := [0, 1, 1, 0, 0, 1, 1, 0, 0, 1, 1, 0, 0, 1, 1]
e[4] := [1, 0, 1, 0, 1, 0, 1, 0, 1, 0, 1, 0, 1, 0, 1]
e[5] := [0, 0, 0, 0, 0, 0, 0, 0, 1, 1, 0, 0, 1, 1]
e[6] := [0, 0, 0, 0, 0, 0, 0, 1, 0, 1, 0, 1, 0, 1]
e[7] := [0, 0, 0, 0, 1, 1, 0, 0, 0, 0, 0, 0, 1, 1]
e[8] := [0, 0, 0, 1, 0, 1, 0, 0, 0, 0, 0, 1, 0, 1]
e[9] := [0, 0, 0, 0, 0, 0, 0, 0, 0, 0, 1, 1, 1, 1]
e[10] := [0, 0, 1, 0, 0, 0, 1, 0, 0, 0, 1, 0, 0, 0, 1]

⌐·-·-·¬
⌊·_·_·⌋ : 9 bases of $C_{1,1}$

⌐-----¬
⌊_____⌋ : 10 bases of $C_1$

FIG. 10 b[1]  := [0, 0, 0, 0, 0, 0, 0, 1, 1, 1, 1, 1, 1, 1, 1, 0, 0, 0, 0, 0]
b[2]  := [0, 0, 0, 1, 1, 1, 1, 0, 0, 0, 0, 1, 1, 1, 1, 0, 0, 0, 0, 0]
b[3]  := [0, 1, 1, 0, 0, 1, 1, 0, 0, 1, 1, 0, 0, 1, 1, 0, 0, 0, 0, 0]
b[4]  := [1, 0, 1, 0, 1, 0, 1, 0, 1, 0, 1, 0, 1, 0, 1, 0, 0, 0, 0, 0]
b[5]  := [0, 0, 0, 0, 0, 0, 0, 0, 0, 1, 1, 0, 0, 1, 1, 0, 0, 0, 0, 0]
b[6]  := [0, 0, 0, 0, 0, 0, 0, 1, 0, 1, 0, 1, 0, 1, 0, 0, 0, 0, 0, 0]
b[7]  := [0, 0, 0, 0, 0, 1, 1, 0, 0, 0, 0, 0, 0, 1, 1, 0, 0, 0, 0, 0]
b[8]  := [0, 0, 0, 0, 1, 0, 1, 0, 0, 0, 0, 0, 1, 0, 1, 0, 0, 0, 0, 0]
b[9]  := [0, 0, 0, 0, 0, 0, 0, 0, 0, 0, 0, 1, 1, 1, 1, 0, 0, 0, 0, 0]
b[10] := [0, 0, 1, 0, 0, 0, 1, 0, 0, 0, 1, 0, 0, 0, 1, 1, 1, 1, 1, 1]

[ - - - - ] : 10 bases of $C_1$

[ ____ ] : 1 bases of $C_2$

FIG. 12 m[1] := [0, 0, 0, 0, 0, 0, 0, 0, 1, 1, 1, 1, 1, 1, 1, 1]
m[2] := [0, 0, 0, 0, 1, 1, 1, 1, 0, 0, 0, 0, 1, 1, 1, 1]
m[3] := [0, 0, 1, 1, 0, 0, 1, 1, 0, 0, 1, 1, 0, 0, 1, 1]
m[4] := [0, 1, 0, 1, 0, 1, 0, 1, 0, 1, 0, 1, 0, 1, 0, 1]
m[5] := [0, 0, 0, 0, 0, 0, 0, 0, 0, 0, 1, 1, 0, 0, 1, 1]
m[6] := [0, 0, 0, 0, 0, 0, 0, 0, 0, 1, 0, 1, 0, 1, 0, 1]
m[7] := [0, 0, 0, 0, 0, 0, 1, 1, 0, 0, 0, 0, 0, 0, 1, 1]
m[8] := [0, 0, 0, 0, 0, 1, 0, 1, 0, 0, 0, 0, 1, 0, 1, 0]
m[9] := [0, 0, 0, 0, 0, 0, 0, 0, 0, 0, 0, 0, 1, 1, 1, 1]
m[10] := [0, 0, 0, 1, 0, 0, 0, 1, 0, 0, 0, 1, 0, 0, 0, 1]

[ ⌐ ¬ ] : 10 bases of $C_1$

[ ⌐ ¬ ] : 9 bases of $C_{1,1}$ $m[1] := [0, 0, 0, 0, 0, 0, 0, 0, 1, 1, 1, 1, 1, 1, 1, 1]$
$m[2] := [0, 0, 0, 0, 1, 1, 1, 1, 0, 0, 0, 0, 1, 1, 1, 1]$
$m[3] := [0, 0, 1, 1, 0, 0, 1, 1, 0, 0, 1, 1, 0, 0, 1, 1]$
$m[4] := [0, 1, 0, 1, 0, 1, 0, 1, 0, 1, 0, 1, 0, 1, 0, 1]$
$m[5] := [0, 0, 0, 0, 0, 0, 0, 0, 0, 1, 1, 0, 0, 1, 1]$
$m[6] := [0, 0, 0, 0, 0, 0, 0, 1, 0, 1, 0, 1, 0, 1]$
$m[7] := [0, 0, 0, 0, 0, 1, 1, 0, 0, 0, 0, 0, 0, 1, 1]$
$m[8] := [0, 0, 0, 0, 1, 0, 1, 0, 0, 0, 0, 0, 1, 0, 1]$
$m[9] := [0, 0, 0, 0, 0, 0, 0, 0, 0, 0, 0, 1, 1, 1, 1]$
$m[10] := [0, 0, 0, 1, 0, 0, 0, 1, 0, 0, 0, 1, 0, 0, 0, 1]$ : 10 bases of $C_1$ (1st embodiment)

: 8 bases of $C_{1,1}$ (1st embodiment)

: 10 bases of $C_1$ (3rd embodiment)

: 9 bases of $C_{1,1}$ (3rd embodiment)

FIG. 14 b[1]  := [0, 0, 0, 0, 0, 0, 0, 0, 1, 1, 1, 1, 1, 1, 1, 1, 0, 0, 0, 0]
b[2]  := [0, 0, 0, 0, 1, 1, 1, 1, 0, 0, 0, 0, 1, 1, 1, 1, 0, 0, 0, 0]
b[3]  := [0, 0, 1, 1, 0, 0, 1, 1, 0, 0, 1, 1, 0, 0, 1, 1, 0, 0, 0, 0]
b[4]  := [0, 1, 0, 1, 0, 1, 0, 1, 0, 1, 0, 1, 0, 1, 0, 1, 0, 0, 0, 0]
b[5]  := [0, 0, 0, 0, 0, 0, 0, 0, 0, 0, 1, 1, 0, 0, 1, 1, 0, 0, 0, 0]
b[6]  := [0, 0, 0, 0, 0, 0, 0, 0, 0, 1, 0, 1, 0, 1, 0, 1, 0, 0, 0, 0]
b[7]  := [0, 0, 0, 0, 0, 0, 1, 1, 0, 0, 0, 0, 0, 0, 1, 1, 0, 0, 0, 0]
b[8]  := [0, 0, 0, 0, 0, 1, 0, 1, 0, 0, 0, 0, 0, 1, 0, 1, 0, 0, 0, 0]
b[9]  := [0, 0, 0, 0, 0, 0, 0, 0, 0, 0, 0, 0, 1, 1, 1, 1, 0, 0, 0, 0]
b[10] := [0, 0, 0, 1, 0, 0, 0, 1, 0, 0, 0, 1, 0, 0, 0, 1, 1, 1, 1, 1]

: 10 bases of $C_1$

: 1 bases of $C_2$

METHODS OF JOINT CODING IN MOBILE COMMUNICATION SYSTEM

CROSS-REFERENCE TO RELATED APPLICATIONS

This application is a 371 U.S. national stage application of International Application No. PCT/KR2008/006693 filed on Nov. 13, 2008, which claims the benefit of earlier filing date and right of priority to Korean Patent Application No. 10-2008-0076473, filed on Aug. 5, 2008, and U.S. Provisional Application Ser. No. 60/988,809 filed on Nov. 18, 2007, the contents of each of which is hereby incorporated by reference herein in its entirety.

TECHNICAL FIELD

The present invention relates to data coding in a mobile communication system, and more particularly, to a method of coding two different data differing from each other in reception signal quality by a single coding scheme.

BACKGROUND ART

Generally, information transceived between transmitting and receiving sides in a communication system is classified into control information and data information. The data information means user data corresponding to payload, whereas the control information means such information for transceiving data information on a transport channel as system configuration, a modulation scheme, a coding scheme and the like. In order to efficiently use limited radio resources, the control information is configured to have a minimum length in general and undergoes a coding scheme that is strong against error on a radio channel due to its influence on system performance.

Coding schemes can be categorized into a blocking scheme, a convolutional coding scheme and a turbo coding scheme. In the block coding scheme, an input sequence is coded once by a block unit without using a memory. Unlike the convolutional coding scheme, this means that a generated codeword has not a variable length but a fixed codeword length. Widely used codes include Hamming code, RS (Reed-Solomon) code and RM (Reed Muller) code for example.

The convolutional coding scheme uses a shift register as a sort of memory and is mainly used for coding of speech data. The turbo coding scheme performs coding by a combination means of a recursive systematic convolutional (RSC) coder, interleaving and iterative decoding and is mainly used in coding not speech data but user data.

In the above-described coding schemes, regarding contents of input data to be coded, a presence or non-presence of iterative permissibility of input data transfer, transfer delay sensitivity, significance of transmission contents and the like, which one of the coding schemes will be used is determined according to what kind of level of a reception signal quality is required.

In 3GPP ($3^{rd}$ generation partnership project: standardization organization of $3^{rd}$ generation mobile communication system) mobile communication system, as a coding scheme for control information, a short-length block coding scheme based on RM coding, a tail-biting convolutional coding scheme, a simplex coded iterative coding scheme or the like is used.

In the above-described coding schemes, which coding scheme will be applied is determined according to a reception signal quality (target quality) requested by the above-transmitted control information in a receiving side. Generally, control informations coded by a specific coding scheme are requested to meet the same signal quality (e.g., block error rate, etc.).

DISCLOSURE OF THE INVENTION

Technical Problem

However, as mentioned in the foregoing description, in case of coding control information of a mobile communication system, it is unable to code control information requesting a reception signal quality (target quality) in a same manner of another control information requesting a different reception signal quality.

Technical Solution

Accordingly, the present invention is directed to methods of joint coding in mobile communication system that substantially obviate one or more of the problems due to limitations and disadvantages of the related art.

An object of the present invention is to provide a method of coding data requesting different target qualities in a mobile communication using one coding scheme.

Another object of the present invention is to raise system efficiency by coding a plurality of data with a less transmission power.

Additional features and advantages of the invention will be set forth in the description which follows, and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in performing block coding on $k_1$-bit first data requiring a received signal quality and $k_2$-bit second data requiring a different received signal quality, a method of joint coding according to the present invention includes the steps of configuring a first block code generation matrix meeting a first minimum hamming distance, configuring a second block code generation matrix meeting a second minimum hamming distance, configuring a third block code generation matrix including the first block code generation matrix, the second block code generation matrix and a zero matrix having a predetermined size, and coding a serial combination data of the first and second data to have an n-bit length using the third block code generation matrix.

Preferably, the first block code generation matrix is divided into a first partial matrix having a third minimum hamming distance equal to or greater than the first minimum hamming distance and a second partial matrix having a fourth minimum hamming distance equal to or greater than the first minimum hamming distance.

Preferably, the received signal quality required for the second data is higher than the received signal quality required for the first data.

Preferably, a last n2 column of the third block code generation matrix is column-permutated with a rest column.

Preferably, the n2 column indicates a column size of the second block code generation matrix.

It is to be understood that both the foregoing general description and the following detailed description are exemplary and explanatory and are intended to provide further explanation of the invention as claimed.

Advantageous Effects

Accordingly, embodiments of the present invention provide the following effects.

First of all, two data requesting different signal qualities are coded by one coding scheme and are then transferred. Therefore, it is able to provide a reception signal quality (target quality) requested per data in decoding the corresponding data.

Secondly, the present invention is able to satisfy reception signal qualities of two transmission data with a small transmission power, thereby raising efficiency of system.

DESCRIPTION OF DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 6 is a diagram of a block code generation matrix according to a first LTE applied embodiment of the present invention;

FIG. 9 is a diagram of a block code generation matrix according to a second LTE applied embodiment of the present invention;

FIG. 10 is a diagram of a block code generation matrix according to a second LTE applied embodiment of the present invention;

FIG. 12 is a diagram of a block code generation matrix according to a third LTE applied embodiment of the present invention;

FIG. 14 is a diagram of a block code generation matrix according to a third LTE applied embodiment of the present invention.

BEST MODE

Mode for Invention

Reference will now be made in detail to the preferred embodiments of the present invention, examples of which are illustrated in the accompanying drawings.

First of all, the following-described embodiments proposed by the present invention are applicable to a multi-carrier multi-access system, and more particularly, to a mobile communication system using OFDM (hereinafter named 'OFDM mobile communication system') for example.

And, the following-described embodiments proposed by the present invention are applicable to MC-CDMA (multi-carrier CDMA), SC-FDMA (single carrier FDMA), WH-FDMS (Walsh-Hadamard FDMS), and DFT (discrete Fourier transform) spread OFDMA.

Moreover, the present invention is applicable to IEEE 802.16e system and IEEE 802.16m system, which are the standards for OFDM mobile communication systems [for related standard specifications, refer to IEEEStd 802.16e-2005 and http://www.ieee.org/16/published.html].

Besides, the present invention is applicable to another similar mobile communication system such as E-UTRAN (evolved universal terrestrial radio access) called LTE (long term evolution).

E-UMTS is the system that has evolved from WCDMA UMTS and its basic standardization is ongoing by 3GPP. Moreover, the UMTS is called LTE (long term evolution) system. For the details of technical specifications of UMTS and E-UMTS, it is able to refer to Release 7 and Release 8 of '3$^{rd}$ Generation Partnership Project: Technical Specification Group Radio Access Network', respectively. The present invention is applicable to such IMT-A system as LTE-A (advanced). And, the present invention is available for various communication systems including single or multi antenna systems.

Generally, a communication system is widely deployed to provide various communication services for speech data, packet data and the like. This technology is usable in downlink or uplink. Downlink means a communication from a base station to a terminal and uplink means a communication from a terminal to a base station. A base station is a fixed point for communication with a terminal and includes a network except a terminal in a communication system including an upper layer as well as a physical transmitting side. Therefore, in the present invention, a network or a base station is a part symmetric to a terminal and has the same meaning. Besides, a terminal is fixed or can have mobility.

Figure 1A:
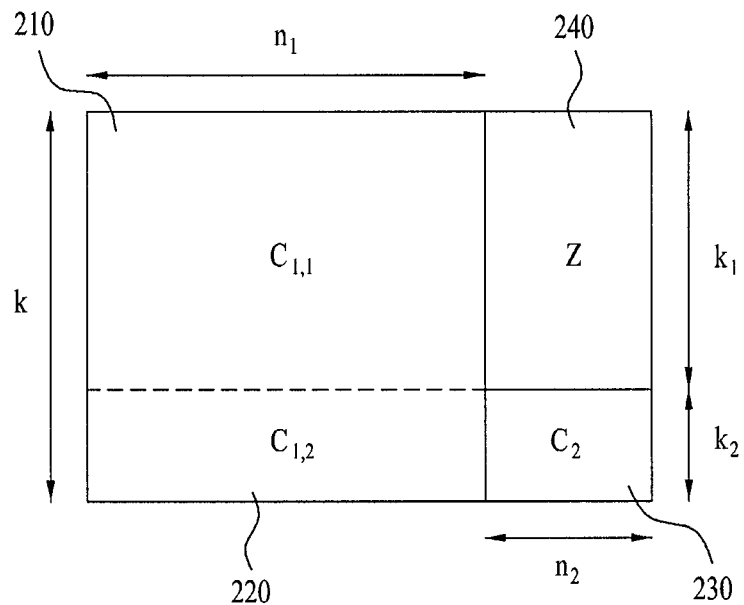
FIG. 1a is a diagram for a joint coding method of cording two data by one coding scheme according to one embodiment of the present invention.

FIG. 1a is a diagram for a joint coding method of cording two data by one coding scheme according to one embodiment of the present invention.

In particular, in the embodiment shown in FIG. 1a, illustrated is a structure of block-coded codeword generation matrix capable of providing a minimum hamming distance for each of the two different data. First of all, in order to make a codeword generation matrix shown in FIG. 1a, a code C=(n, k) is designed to provide different minimum hamming distances for two different input data, respectively. In this case, n=n1+n2 and k=k1+k2. Specifically, 'k1' indicates a length of first data and 'k2' indicates a length of second data. Preferably, the present embodiment is able to use linear block coding as a method of generating the code C.

In the following embodiments, designing a code C=(n, k) means to design a block code generation matrix to code k-bit input data to be inputted by a block code scheme. Moreover, the code C=(n, k) [hereinafter abbreviated 'code C'] means a set of codewords generated from the block code generation matrix and the input data. This explained in detail with reference to Formula 1.

$$C=(n,k) \quad \text{[Formula 1]}$$

In Formula 1, 'n' indicates a length of a generated codeword and 'k' indicates a length of coded input data. And, it is n≥k in general.

In this case, a codeword C=(n, k) [hereinafter abbreviated 'code C'] means that a codeword (one of generatable $2^k$) having a length n is generated in case of coding data having a length k by a specific block coding method.

$$C=(n,k,d) \quad \text{[Formula 2]}$$

In Formula 2, 'n' and 'k' are equal to those of Formula 1. And, 'd' means a minimum hamming distance between codewords in a set of generatable codeword C. Hamming distance is the number of positions differing in bit value at positions of the respective bits in different binary bit sequences. In particular, if X={10101} and Y={00000}, a hamming distance between X and Y is 3. In this case, a hamming distance between two bit sequences is equal to a hamming weight value corresponding to the number of '1' in a result from performing exclusive-OR on the two bit sequences. And, a minimum hamming distance means a minimum hamming distance among hamming distances between two random bit sequences in at least three different bit sequences.

It is widely known that a codeword having a greater minimum hamming distance between codewords generated from variable input data having a prescribed length and a specific block code generation matrix has a better error correction characteristic on a radio channel for input data. In the following embodiment, designing a code C=(n, k, d) means a block code generating unit generating one codeword from a codeword set having a length n, which makes a minimum hamming distance d for variable input data having a length k, and more particular, to generate a block code generation matrix.

In the present embodiment, in order to design a code C=(n, k) providing different minimum hamming distances for first data to be coded (i.e., first input data) and second data to be coded (i.e., second input data), respectively, codes $C_1$=($n_1$, k, $d^{(1)}_{min}$) 210 and 220 and a code $C_2$=($n_2$, $k_2$, $d^{(2)}_{min}$) 230.

It is able to divide the code $C_1$ into a sub-code $C_{1,1}$=($n_1$, $k_1$, $d^{(1,1)}_{min}$) 210 and a sub-code $C_{1,2}$=($n_1$, $k_2$, $d^{(1,2)}_{min}$) 220. And, the sub-codes have minimum hamming distance characteristics shown in Formula 3 and Formula 4, respectively.

$$d^{(1,1)}_{min} \geq d^{(1)}_{min} \quad \text{[Formula 3]}$$

Namely, a minimum hamming distance of the sub-code $C_{1,1}$ is equal to or greater than a minimum hamming distance of the code $C_1$.

$$d^{(1,2)}_{min} \geq d^{(1)}_{min} \quad \text{[Formula 4]}$$

Namely, a minimum hamming distance of the sub-code $C_{1,2}$ is equal to or greater than a minimum hamming distance of the code $C_1$.

And, a zero matrix (k1 rows and n2 columns) 240, i.e., a $k_1 \times n_2$ zero matrix is generated.

By combining the above-designed and generated $C_1$ code generation matrix, $C_2$ code generation matrix and zero matrix like FIG. 1, it is able to configure a block code generation matrix for coding two data requesting different received signal qualities (target qualities) by one coding scheme according to the purpose of the present invention.

Figure 1B:
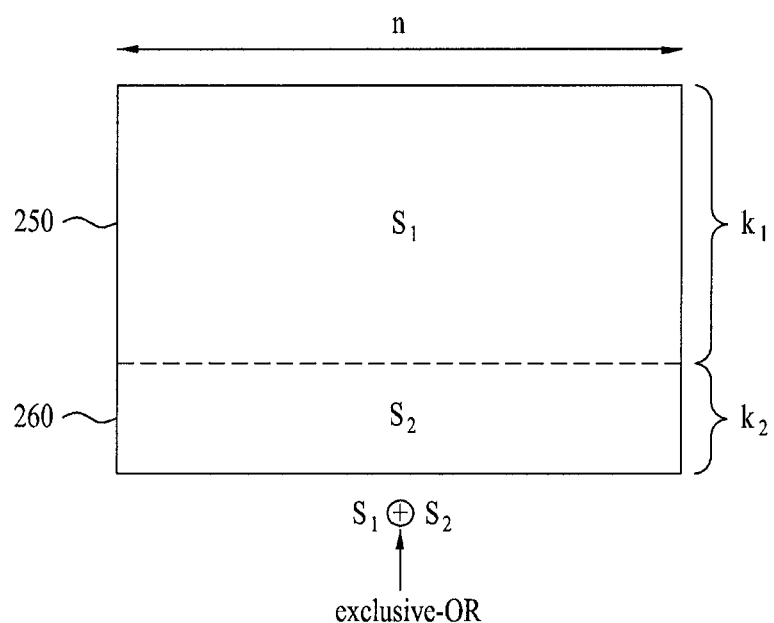
FIG. 1b is a diagram of a block code generation matrix according to one embodiment of the present invention.

In this case, the sub-code $C_{1,1}$ generation matrix, the sub-code $C_{1,2}$ generation matrix, the code $C_2$ generation matrix and the zero matrix are called basic matrixes of the block code generation matrix. FIG. 1b is a diagram of a block code generation matrix according to one embodiment of the present invention.

Referring to FIG. 1b, a code C generation matrix can be separated from two sub codes $S_1$=(n, k1) and $S_2$=(n, k2). Formula 5 represents $S_1$ and $S_2$.

$$S_1 = \{s_i^{(1)} \mid i = 0, 1, \ldots 2^{k_1} - 1\}, \quad \text{[Formula 5]}$$
$$S_2 = \{s_j^{(2)} \mid j = 0, 1, \ldots 2^{k_2} - 1\}$$
where
$$s_i^{(1)} = (c_{i,0}^{(1,1)}, c_{i,1}^{(1,1)}, \ldots, c_{i,n_1-1}^{(1,1)}, 0, 0, \ldots, 0)$$
$$= (c_i^{(1,1)}, 0, 0, \ldots, 0)$$
$$s_j^{(2)} = (c_{j,0}^{(1,2)}, c_{j,1}^{(1,2)}, \ldots, c_{j,n_1-1}^{(1,2)}, c_{j,0}^{(2)}, c_{j,1}^{(2)}, \ldots, c_{j,n_2-1}^{(2)})$$
$$= (c_j^{(1,2)}, c_j^{(2)})$$

In Formula 5, $C_i^{(1,1)}$, $C_j^{(1,2)}$ and $C_j^{(2)}$ indicate rows of a code $C_{1,1}$ generation matrix, a code $C_{1,2}$ generation matrix and a code $C_2$ generation matrix, respectively. In Formula 5, each of $C_{i,k}^{(1,1)}$ and $C_{j,k}^{(1,2)}$ means a $k^{th}$ element of a selected row of the code $C_{1,1}$ generation matrix.

Figure 2:
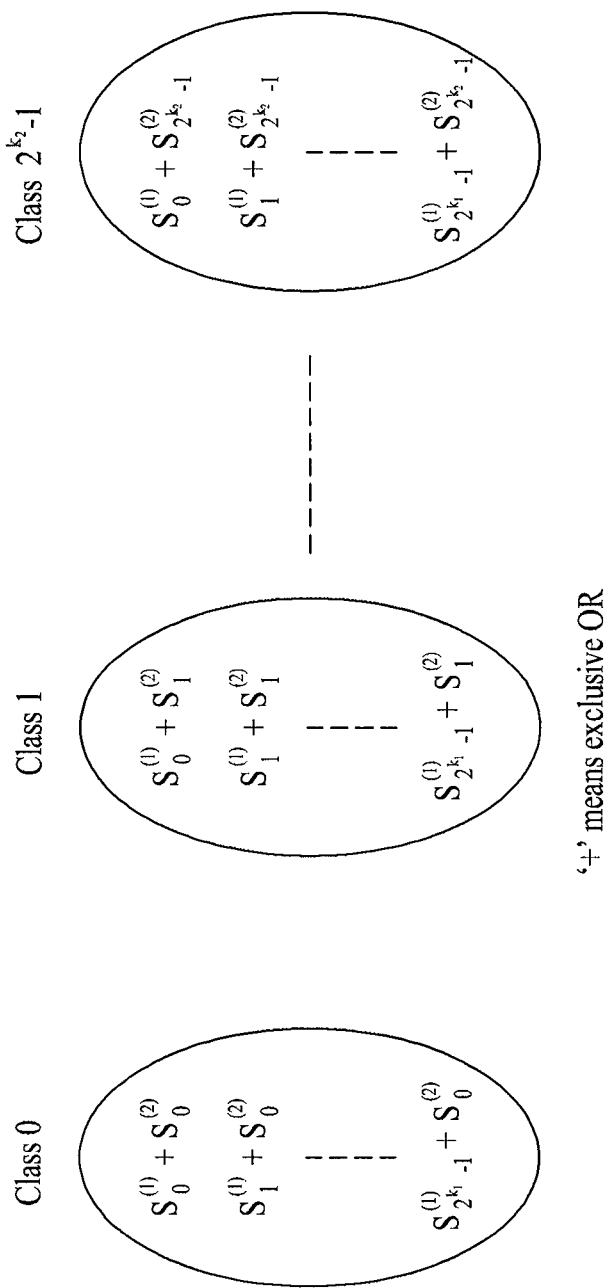
FIG. 2 is a diagram of sorting codeword sets in a codeword generating method according to another embodiment of the present invention.

FIG. 2 is a diagram of sorting codeword sets in a codeword generating method according to another embodiment of the present invention.

First of all, a sub-codeword generated from coding first input data of a length $k_1$ using the block code generation matrix 250 for generating the sub-code $S_1$, as shown in FIG. 1b, corresponds to $S_i^{(1)}$ shown in Formula 5. And, a sub-codeword generated from coding second input data of a length $k_2$ using the block code generation matrix 260 for generating the sub-code $S_2$, as shown in FIG. 1b, corresponds to $S_j^{(2)}$ shown in Formula 5.

A summed codeword value eliminated by performing exclusive-OR sum between elements of codewords of $S_i^{(1)}$ and $S_j^{(2)}$ is identical to the codeword generated from performing block coding using the block coding generation matrix for generating a code C by setting the first input data and the second input data in FIG. 1a to one input data (connecting the second input data to the first input data continuously). This is obtained from characteristics of a linear block coding matrix. FIG. 2 illustrates a sorting method of codeword set of code C for coding two different data by one coding scheme using the characteristics of the linear block coding matrix.

In FIG. 2, a sum of codewords means a sum of vectors for performing exclusive-OR sum between elements of the respective codewords. Total $2^{k2}$ codewords are generatable from the second input data of length k2. In the embodiment shown in FIG. 2, a class is made with reference to a codeword generatable from the second input data. And, exclusive-OR is performed on all codewords generatable from the second input data and the first input data in each class. As mentioned in the foregoing description, this indicates all cases of codewords generated in case that one input data having first and second input data connected in series (hereinafter called combined input data) undergoes a block coding generation matrix for generating a code C.

The class 0 shown in FIG. 2 indicates all cases in case of performing element-to-element exclusive-OR sum on a first codeword $S_0^{(2)}$ among total $2^{k2}$ generatable codewords for the second input data and each of total $2^{k1}$ generatable codewords $$S0(10, S1(1), \ldots S^{(1)}_{2^{k_1}-1}$$

of first input data.

The class 1 indicates all cases in case of performing element-to-element exclusive-OR sum on a second codeword $S_1^{(2)}$ among total $2^{k2}$ generatable codewords for the second input data and each of total $2^{k1}$ generatable codewords of first input data. In this manner, it is able to represent the subsequent classes up to the class $2^{k2}-1$.

In this case, a hamming distance between a codeword represented as an exclusive-OR sum between sub-codewords $S_1$ and $S_2$ selected from one random class and another codeword represented as an exclusive-OR sum between another sub-codewords $S_1$ and $S_2$ selected from the same class can be represented as Formula 6.

$$d(s_i^{(1)}+s_t^{(2)}, s_j^{(1)}+s_t^{(2)})=w(s_i^{(1)}+s_t^{(2)}+s_j^{(1)}+s_t^{(2)})= \\ w(s_i^{(1)}+s_j^{(1)}) \geq d_{min}^{(1,1)} \geq d_{min}^{(1)}, i \neq j$$ [Formula 6]

In Formula 6, 'd(a, b)' indicates a hamming distance between codewords a and b and 'w(a) indicates a hamming weight off the codeword a.

In this case, the hamming weight means the number of non-zero elements among elements of a random codeword. The hamming weight of the random codeword is equal to a hamming distance of a codeword constructed with zeros having the same length only.

Formula 6 has the following meaning. First of all, a hamming distance between a codeword represented as an exclusive-OR sum between sub-codewords $S_1$ and $S_2$ selected from one random class and another codeword represented as an exclusive-OR sum between another sub-codewords $S_1$ and $S_2$ selected from the same class is equal to a hamming weight resulting from performing exclusive-OR on the selected sub-codewords. And, this value is also equal to a hamming weight of two sub-codewords S1 (i.e., $S_1^{(1)}$ and $S_j^{(2)}$) of the selected class [since exclusive-OR sum of two same St(2) is 0, calculation of hamming weight is not affected].

Thus, the hamming weight of the sub-codeword of the sub-code $S_1$ selected within the class and the hamming weight of the sub-code $S_2$ of the sub-codeword is naturally equal to a minimum hamming distance $d^{(1,1)}$ of the sub-code $S_1$, and $d^{(1,1)}$ will be equal to or greater than $d^{(1)}_{min}$. In particular, an intra-class minimum hamming distance within a random class can be represented as Formula 7.

$$d_{min}^{(intra)}=d_{min}^{(1,1)} \geq d_{min}^{(1)}$$ [Formula 7]

Likewise, a hamming distance between codewords selected from two different classes $t_1$ and $t_2$ ($t_1 \neq t_2$) can be represented as Formula 8.

$$d(s_i^{(1)}+s_{t_1}^{(2)}, s_j^{(1)}+s_{t_2}^{(2)})=w(s_i^{(1)}+s_{t_1}^{(2)}+s_j^{(1)}+s_{t_2}^{(2)})= \\ d(s_i^{(1)}+s_j^{(1)}, s_{t_1}^{(1)}+s_{t_2}^{(2)}) \geq d_{min}^{(1)} \circ d_{min}^{(2)}, i \neq j$$ [Formula 8]

Formula 8 is derived from the property that a hamming distance between two random codewords is equal to a hamming weight of the two codewords and the property that such a matrix characteristic as a minimum hamming distance and the like is identical despite generating a codeword by switching rows and columns of a linear block code generation matrix with each other. In particular, a minimum hamming distance between two random different classes (inter-class minimum hamming distance: $d_{min}^{(inter)}$) can be represented as Formula 9.

$$d_{min}^{(inter)}=d_{min}^{(1)}+d_{min}^{(2)}$$ [Formula 9]

Meanwhile, $S_i^{(1)}+S_j^{(1)}$ shown in Formula 6 and $S_{t1}^{(2)}+S_{t2}^{(2)}$ shown in Formula 8 can be represented as Formula 10.

$$s_i^{(1)}+s_j^{(1)}=(c_{u,0}^{(1)}, c_{u,1}^{(1)}, \ldots, c_{u,n_1-1}, 0, \ldots, 0)= \\ (c_u^{(1)}, 0, \ldots, 0)$$

$$s_{t_1}^{(2)}+s_{t_2}^{(2)}=(c_{v,0}^{(1)}, c_{v,1}^{(1)}, \ldots, c_{v,n_1-1}, c_{w,0}^{(2)}, \\ c_{w,1}^{(2)}, \ldots, c_{w,n_2-1}^{(2)})=(c_v^{(1)}, c_w^{(2)}), t_1 \neq t_2$$ [Formula 10]

In Formula 10, $c_u^{(1)}$ and $c_v^{(1)}$ are codewords of a code $C_1$ shown in FIG. 1. And, $c_w^{(2)}$ is a codeword of a code $C_2$. $c_{u,k}^{(1)}$ indicates a $k^{th}$ element of the codeword $c_u^{(1)}$ (where $0 \leq k \leq n_1-1$), $c_{v,k}^{(1)}$ indicates a $k^{th}$ element of the codeword $c_v^{(1)}$ (where $0 \leq k \leq n_1-1$), and $c_{w,k}^{(2)}$ indicates a $k^{th}$ element of the codeword $c_w^{(2)}$ (where $0 \leq k \leq n_2-1$). In this case, $n_1$ indicates a length of a codeword of the code $C_1$ and $n_2$ indicates a length of a codeword of the code $C_2$.

From Formulas 6 to 10, a minimum hamming distance of the code C=(n, k, $d_{min}$) shown in FIG. 1a, which codes two input data respectively requesting different target qualities by one coding scheme according to the purpose of the present invention, can be represented as Formula 11.

$$d_{min}=\min(d_{min}^{(1,1)}, d_{min}^{(1)}+d_{min}^{(2)})$$ [Formula 11]

Namely, since a codeword generated from the code C block code generation matrix shown in FIG. 1a is eventually equal to codewords obtained from the classes shown in FIG. 2, it means that the minimum hamming distance of the code C is equal to a smaller one selected from the group consisting of an intra-class minimum hamming distance obtained from Formula 7 and a minimum hamming distance between random different classes, which is obtained from Formula 9.

Another embodiment of the present invention proposes a method of enabling input data requesting a higher signal quality to have a greater minimum hamming distance in case that a requested signal quality has priority between input data in coding two input data by one coding scheme. For this, in case of coding input data having different received signal qualities, an equal minimum hamming distance exists between codewords existing within a random class, different hamming distances exist between codewords existing in different classes, and a block code generation matrix having the characteristic shown in FIG. 12 is then designed.

$$d_{min}^{(inter)}>d_{min}^{(intra)}$$ [Formula 12]

To meet the above requirements, it is able to select a sub-code $C_{1,1}$ of $d_{min}^{(1,1)}=d_{min}^{(1)}$ and a code $C_1$. For this, after a block code generation matrix of the code $C_1$ has been designed, it is able to separate the code $C_1$ into the sub-code $C_{1,1}$ and a sub-code $C_{1,2}$ to establish the relation of $d_{min}^{(1,1)}=d_{min}^{(1)}$.

If the condition of Formula 12 is met, a probability of decoding a specific codeword of a code C into another codeword out of a class incorrectly becomes lower than a probability of decoding the specific codeword into another codeword within the class. This is attributed to the class sorting and the different minimum hamming distance characteristic between classes, which are shown in FIG. 2.

For description, assume that a codeword of a code C is transmitted on a radio channel. In this case, the code C is represented by exclusive-OR of sub-codes $S_1$ and $S_2$ in a manner of selecting a specific class for first input data and second input data, as shown in FIG. 2, and coding it with a codeword of each of the sub-codes $S_1$ and $S_2$. When a receiving side having received the transmitted codewords of the code C decodes the codewords, if error occurs in the received codewords of the code C due to loss in the course of radio transmission, a probability of decoding into another specific class instead of the specific class selected and transmitted by the transmitting side becomes higher than a probability of decoding into a non-transmitted codeword of the sub-code $S_1$ instead of a correct codeword of the sub-code $S_1$ in the transmitted specific class. In particular, the codeword of the sub-code $S_2$ is stronger against error than the codeword of the sub-code $S_1$.

Using this characteristic, it is able to allocate input data, which requests a received signal quality higher than that of the codeword of the sub-code $S_1$, to the codeword of the sub-code $S_2$.

Figure 3:
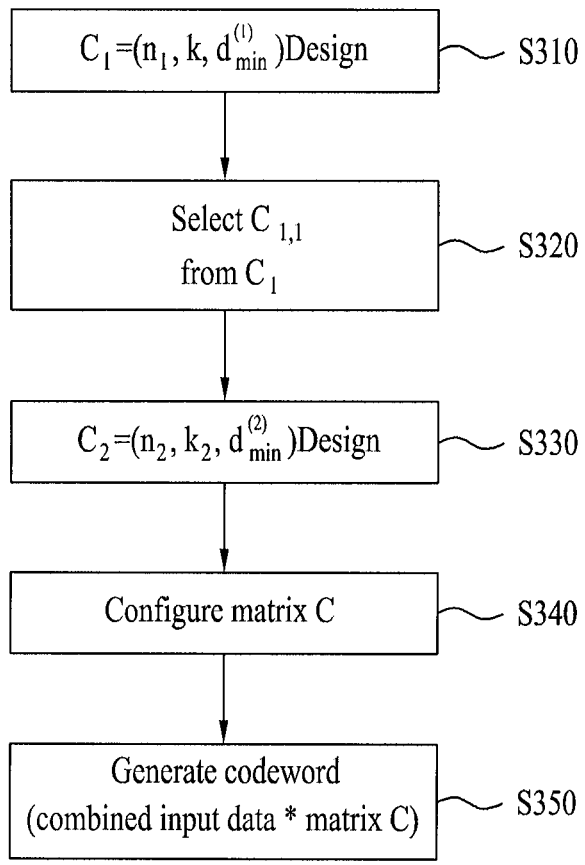
FIG. 3 is a flowchart of a joint coding procedure according to one embodiment of the present invention.

FIG. 3 is a flowchart of a joint coding procedure according to one embodiment of the present invention. FIG. 3 shows a joint coding procedure for coding two input data, which request different target qualities, respectively, by one coding scheme in association with the embodiments shown in FIGS. 1A to 2.

Assume that data inputted first is first input data. Assume that data inputted second is second input data. And, it is able to assume a situation that a received signal quality of the second input data may be better than that of the first input data.

The first input data has a length of $k_1$ bits. If the first input data is coded, it becomes a codeword having $n_1$ elements. The second input data has a length of $k_2$ bits. If the second input data is coded, it becomes a codeword having $n_2$ elements. In this case, $n=n_1+n_2$ and $k=k_1+k_2$. In the present embodiment, the first and second input data are handled as one input data and one codeword is generated using one coding scheme. And, a procedure for coding each of the input data to meet different received signal qualities (target qualities) is explained.

Instead of designing a block coding generation matrix for generating a joint code directly for the above joint coding scheme, a block coding generation matrix is indirectly designed in a manner of designing a plurality of basic matrixes, as shown in FIG. 1, and then combining the designed basic matrixes. The procedure flow is explained in detail as follows.

First of all, a block code generation matrix $C_1$ capable of generating an $n_1$-bit codeword having a minimum hamming distance $d^{(1)}_{min}$ is designed for combined input data having a k-bit length corresponding to a length sum of bit sequences of first and second input data [S310]. A block code generation matrix $C_{1,1}$ capable of generating a codeword of an $n_1$-bit length amounting to a minimum hamming distance $d^{(1,1)}_{min}$ is selected for the first input data from the $C_1$ [S320]. In this case, the selected $C_{1,1}$ can be named $k_1$ bases selected as $C_1$ for $C_{1,1}$.

Subsequently, a block code generation matrix $C_2$ capable of generating an $n_2$-bit codeword having a minimum hamming distance $d^{(2)}_{min}$ is designed for the second input data [S330].

When the block code generation matrixes are designed in the steps S310 and S330, in order to meet the condition that a received signal quality of the second input data should be higher than that of the first input data, it should be designed to meet the condition of Formula 12 [refer to Formula 7 and Formula 9].

Subsequently, one linear block coding generation matrix is designed for a code C including a zero matrix ($k_1 \times n_2$) having a prescribed size, as shown in FIG. 1a) with k rows and n columns [S340].

Finally, one codeword is generated using the above-generated linear block coding generation matrix and the combined input data having 1 row and k columns [S350].

In case of radio-transmitting the above-generated codeword, a severe error may be generated from a specific codeword area due to fading on a radio channel. Although the specific codeword area is coded to meet a better received signal quality like the embodiment shown in FIG. 3, fading is intensively generated from the corresponding codeword area. Therefore, it may be possible that decoding of the corresponding part may fail. Another embodiment of the present invention proposes a method for solving this problem.

Figure 4:
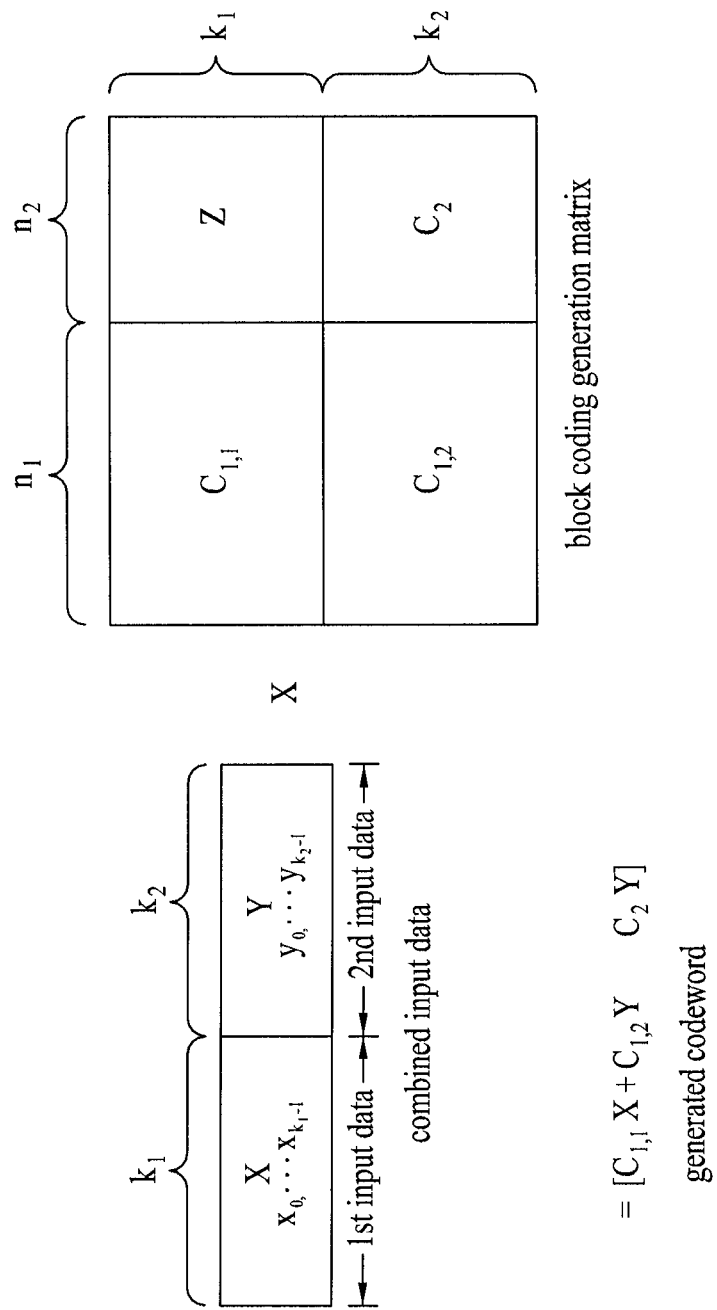
FIG. 4 is a diagram for a method of configuring a block coding generation matrix according to another embodiment of the present invention.

FIG. 4 is a diagram for a method of configuring a block coding generation matrix according to another embodiment of the present invention.

As mentioned in the foregoing description, even if row/column permutation is performed on four basic generation matrixes (i.e., $C_{1,1}$, $C_{1,2}$, $C_2$) of a block coding generation matrix for the code $C=(n, k)$ of the embodiment shown in FIG. 1a, a minimum hamming distance characteristic of a finally generated code C is not affected. In particular, the codeword, which obtained from all possible generation matrix structures obtainable from row/column permutation of basic generation matrix and input data, has the same characteristics of a codeword obtained from a block coding generation matrix of an original code C and input data.

If a burst error is generated from a last $n_2$ bit of a codeword in second input data having high significance using the above property, capability of correcting errors generated from the second input data is considerably degraded. This characteristic is shown in FIG. 4.

Referring to FIG. 4, it can be observed that a rear part ($C_2 \cdot Y$) of a finally generated codeword corresponds to a codeword for the second input data. It may be difficult to decode the second input data due to intensive channel error generated from the corresponding part. In order to prevent this decoding difficulty, another embodiment of the present invention generates a new code in a manner of appropriately distributing a $C_2$ generation matrix part overall whole columns by performing permutation on a last $n_2$ column of a block coding generation matrix (preferably, performing permutation on n1 column).

Figure 5:
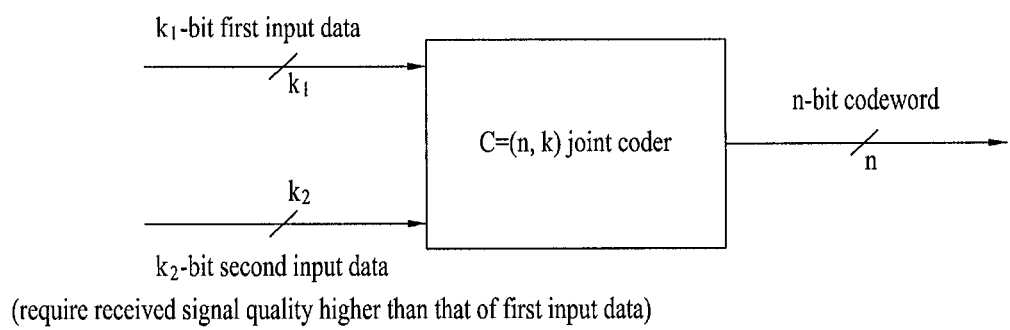
FIG. 5 is a block diagram for performing a joint coding process according to one embodiment of the present invention.

FIG. 5 is a block diagram for performing a joint coding process according to one embodiment of the present invention. First of all, $k_1$-bit first input data requiring a specific received signal quality and $k_2$-bit second input data requiring a specific received signal quality higher than that of the first input data are inputted to one joint coder and are then outputted as an n-bit codeword.

In this case, as mentioned in the foregoing description, a bit sequence is generated by providing the first input data and the second input data to front and rear parts within the joint coder, respectively. Of course, in case that the first input data requires a higher received signal quality, it is provided to the rear part to the contrary of the above example.

The following embodiments relate to the case of applying the present invention to 3GPP LTE system that is a fourth generation mobile communication system. They are explained as follows.

In the 3GPP LTE system, a terminal transmits information on a current channel status to a base station. This information is called a channel quality indicator (hereinafter abbreviated CQI). In particular, the terminal transmits the CQI to the base station over an uplink control channel (physical uplink control channel: PUCCH). When the CQI information is received by a receiving side, i.e., the base station, a block error rate corresponding to a required received signal quality is $10^{-1} \sim 10^{-2}$.

In the 3GPP LTE system, HARQ (hybrid automatic request repeat) is applied. If a transmitting side transmits a data block, a receiving side should notify whether the data block is normally received to the transmitting side. This is called Ack/Nak indicator (acknowledgement of a HARQ process indicator: hereinafter abbreviated AI). When this AI information is received by the receiving side, i.e., the base station, a block error rate corresponding to a required received signal quality is $10^{-2} \sim 10^{-3}$. Therefore, the AI information requiring a higher received signal quality should be coded by a sub-code having a greater minimum hamming distance. In particular, the CQI information and the AI information are applied to the following embodiments by being set to first input data and second input data, respectively.

1. First LTE Applied Embodiment

Basic assumptions of the first embodiment are as follows.
First input data: CQI ($k_1=8$, $n_1=15$)
Second Input data: AI ($k_2=2$, $n_2=5$)
Code $C_1=(15, 10)$ coding scheme: Configured by selecting a part from (16, 11) second order Reed Muller code (hereinafter abbreviated second RM code)
Code $C_2=(5, 2)$ coding scheme: (7, 4) systematic hamming code scheme. (Refer to "The theory of the error correcting codes, North-Holland, 1972 by F. J. MacWilliams and N. J. A. Sloane" for details about the second order Reed Muller code scheme and the systematic hamming code scheme). The following embodiment is applied according to the flowchart shown in FIG. 3.

First of all, a block code generation matrix for $C_1=(15, 10)$ is designed. For this, ten bases are selected from 11 bases of (16, 11) second order RM code except one base. By eliminating one common bit from the selected bases, bases of 15-row and 10-column (15, 10) generation matrix are then configured. For instance, if a base, of which elements are entirely zeros is firstly eliminated from 11 bases of (16, 11) second order RM code, one common bit of the selected 10 bases always becomes 0. Hence, even if a corresponding bit is eliminated from a codeword configured with the ten bases, a hamming weight distribution of a whole codeword is not affected. The bases (d[i], i=0, 1, . . . , 10) of the block code generation matrix shown in FIG. 6 are the bases obtained from this process.

Figure 6:
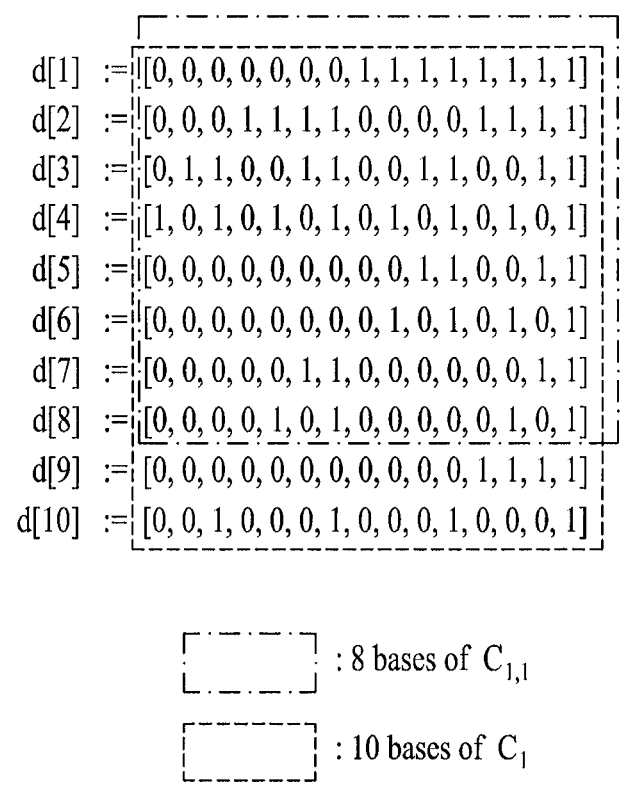

FIG. 6 is a diagram of a block code generation matrix according to a first LTE applied embodiment of the present invention. And, a linear block coding generation matrix for a sub-code $C_{1,1}=(15, 8)$ is configured with eight bases obtained from eliminating two bases from ten bases of a generation matrix of a code $C_1$ in addition. For instance, this can be obtained from eliminating last two bases corresponding to second order bases from the bases of the generation matrix of the code $C_1$ shown in FIG. 6.

In this case, the second order basic matrixes of the second order RM code are primarily eliminated. This is because the number of codewords having a minimum hamming distance can be further reduced in a hamming weight distribution of codeword obtained from the elimination. Block code generation matrix of $C_1$ and $C_{1,1}$, which is obtained by this process, is shown in FIG. 6.

The code $C_1$, as shown in FIG. 6, is constructed with ten bases (10 bases of $C_1$ in FIG. 6) and a sub-code $C_{1,1}$ is constructed with eight bases (8 bases of $C_{1,1}$ in FIG. 6).

In this case, it can be observed that a minimum hamming distance of the code $C_1$ and a minimum hamming distance of the sub-code $C_{1,1}$ can be represented as Formula 13.

$$d_{min}^{(1)}=4, d_{min}^{(1,1)}=4 \qquad \text{[Formula 13]}$$

Subsequently, a block code generation matrix of a code $C_2=(5, 2)$ is designed. As mentioned in the foregoing description, the $C_2$ block coding generation matrix of the present embodiment can be defined as bases obtained from shortening (7, 4) systematic hamming code into (5, 2) code. (For details of a related method, refer to "The theory of the error correcting codes, North-Holland, 1972 by F. J. MacWilliams and N. J. A. Sloane".)

In the present embodiment, bases shown in Formula 14 are used as a block coding generation matrix of a code $C_2$. According to user environment, it is able to use different bases as well.

$$m'[0]=[1,0,1,0,1]/m'[1]=[0,1,1,1,1] \qquad \text{[Formula 14]}$$

In Formula 14, $d^{(2)}_{min}=3$. As it corresponds $d_{min}^{(inter)}=d_{min}^{(1)}+d_{min}^{(2)}=7$, $d_{min}^{(intra)}=d_{min}^{(1,1)}=4$, the condition of Formula 12 is met. Hence, the second input data has a higher received signal quality.

Figure 7:
FIG. 7 is a diagram of a block code generation matrix according to a first LTE applied embodiment of the present invention.
Figure 7:

Based on the codes $C_1$ and $C_2$ generated by the above steps, one block code generation matrix is configured using the basic generation matrixes ($C_{1,1}$, $C_{1,2}$, $C_3$, zero matrix), as shown in FIG. 1*a*, for the code $C=(20, 10)$ joint coding. In FIG. 7, a finally generated block code generation matrix for the present embodiment is shown.

FIG. 7 is a diagram of a block code generation matrix according to a first LTE applied embodiment of the present invention. Bases (u[i], i=0, 1, . . . , 10) of a block code generation matrix finally generated by the procedures shown in FIG. 7 are configured with bases of $C_{1,1}$ and zero matrix or bases of sub-code $C_{1,2}$ and code $C_2$ generation matrixes according to an index i. Moreover, as mentioned in the foregoing description, the above-generated block code generation matrix can be used in a manner of being rendered into another block code generation matrix by performing inter-row/inter-column permutation to be suitable for a system situation.

Subsequently, by allocating 8-bit CQI information to first input data and allocating 2-bit AI information to second input data, the first input data is provided to a front part and the second input data is provided to a rear part, respectively. Thus, a codeword is generated by combining the first input data and the second input data into one serial sequence using the generated block code generation matrix.

Figure 8:
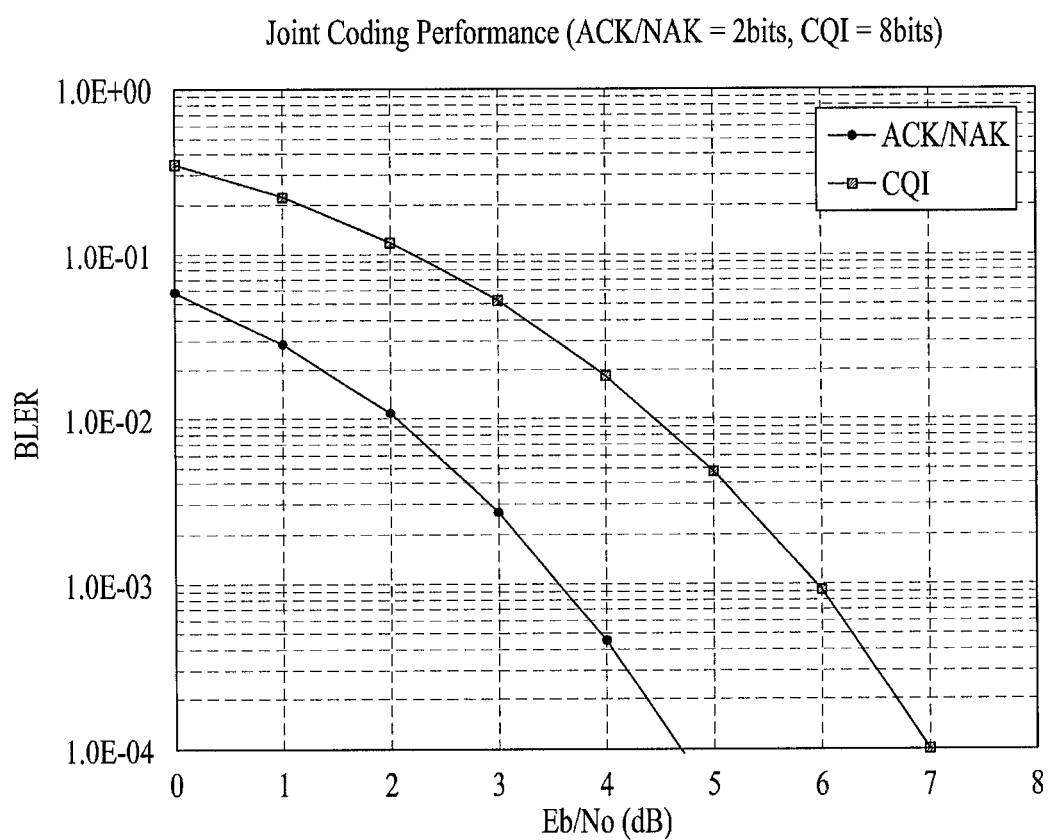
FIG. 8 is a diagram for reception performance in a receiving side if codeword is generated and transmitted on a radio channel according to a first LTE applied embodiment of the present invention.

FIG. 8 is a diagram for reception performance in a receiving side if codeword is generated and transmitted on a radio channel according to a first LTE applied embodiment of the present invention. In the embodiment shown in FIG. 8, a codeword obtained by joint-coding CQI information (8 bits) and AI information (2 bits) according to the first LTE applied embodiment is transmitted and a receiving side performs ML) maximum likelihood) decoding on the codeword to obtain CQI information and AI information. A block error rate (BLER) of each of the CQI information and the AI information is shown in FIG. 8.

Assume that a modulation scheme is BPSK (binary phase shift keying). Assume that a transport channel is AWGN (additive white Gaussian noise) channel. Referring to FIG. 8, it can be observed that each of the CQI information and the AI information meets a received signal quality within transmission energy of about Eb/No=2.5 dB only.

2. Second LTE Applied Embodiment

Basic assumptions of the second embodiment are as follows.
First input data: CQI ($k_1$=9, $n_1$=15)
Second Input data: AI ($k_2$=1, $n_2$=5)
Code $C_1$=(15, 10) coding scheme: Configured by selecting a part from (16, 11) second order Reed Muller code.
Code $C_2$=(5, 1) coding scheme: This can be defined as base of an iterative code.

First of all, for clarity of description, by the same scheme of the first LTE applied embodiment, a block code generation matrix for $C_1$=(15, 10) is designed.

A sub-code $C_{1,1}$=(15, 9) generation matrix is generated by additionally eliminating one base from ten bases of the code $C_1$=(15, 10) generation matrix. In the present embodiment, a sub-code $C_{1,1}$=(15, 9) generation matrix is configured with nine bases resulting from eliminating a bottom base. And, other schemes are applicable according to system situations. A block code generation matrix of the code $C_1$ and the sub-code $C_{1,1}$ obtained from the above process is shown in FIG. 9.

FIG. 9 is a diagram of a block code generation matrix according to a second LTE applied embodiment of the present invention. In this case, it can be observed that minimum hamming distances of code $C_1$ and sub-code $C_{1,1}$ can be represented as Formula 15.

$$d_{min}^{(1)}=4, d_{min}^{(1,1)}=4 \qquad [\text{Formula 15}]$$

Subsequently, a block code generation matrix of code $C_2$=(5, 1) is designed. In the present embodiment, it is able to define the code $C_2$ block code generation matrix as bases of a simple iterative code.

For instance, if Ack and Nak are represented as 1 and 0 in AI information, respectively, an iterative code of the Ack is [1, 1, 1, 1, 1] and an iterative code of the Nak is [0, 0, 0, 0, 0]. Hence, $d^{(2)}_{min}$=5 and $d_{min}^{(inter)}=d_{min}^{(1)}+d_{min}^{(2)}$=9, $d_{min}^{(intra)}=d_{min}^{(1,1)}$=4.

In the present embodiment, a base is selected as [1, 1, 1, 1, 1].

Subsequently, using the above-generated code $C_1$ generation matrix, the above-generated code $C_2$ generation matrix and the zero matrix, a block code generation matrix of a code C=(20, 10), as shown in FIG. 1a, is designed. Example for a configuration of the generated block code generation matrix is shown in FIG. 10.

FIG. 10 is a diagram of a block code generation matrix according to a second LTE applied embodiment of the present invention. Besides, as mentioned in the above description, the above-generated block code generation matrix can be used in a manner of being rendered into another block code generation matrix by performing inter-row/inter-column permutation to be suitable for a system situation.

In this case, since the block coding generation matrixes Shown in FIG. 7 and FIG. 10 are identical to each other except the last five columns, they can be implemented with one base structure.

Subsequently, by allocating 9-bit CQI information to first input data and allocating 1-bit AI information to second input data, the first input data is provided to a front part and the second input data is provided to a rear part. Thus, a codeword is generated by combining the first input data and the second input data into one serial sequence using the generated block code generation matrix.

Figure 11:
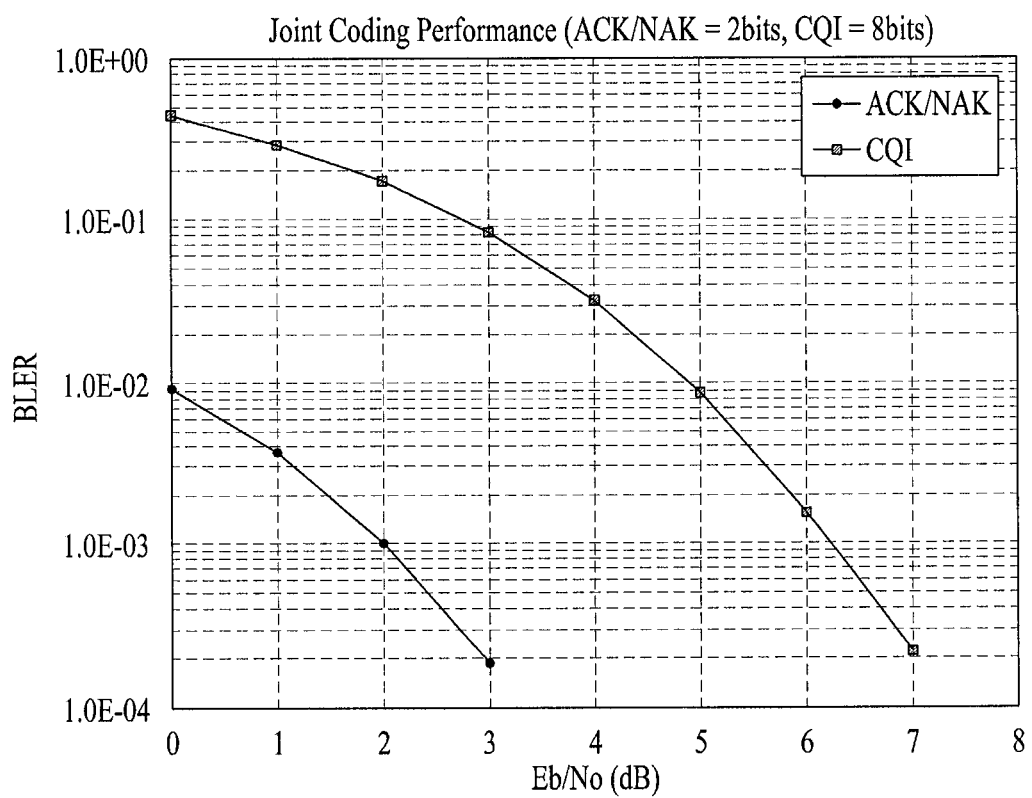
FIG. 11 is a diagram for reception performance in a receiving side if codeword is generated and transmitted on a radio channel according to a second LTE applied embodiment of the present invention.

FIG. 11 is a diagram for reception performance in a receiving side if codeword is generated and transmitted on a radio channel according to a second LTE applied embodiment of the present invention.

In the embodiment shown in FIG. 11, a codeword obtained by joint-coding CQI information (9 bits) and AI information (1 bit) according to the second LTE applied embodiment is transmitted and a receiving side performs ML) maximum likelihood) decoding on the codeword to obtain CQI information and AI information. A block error rate (BLER) of each of the CQI information and the AI information is shown in FIG. 11.

Assume that a modulation scheme is BPSK (binary phase shift keying). Assume that a transport channel is AWGN (additive white Gaussian noise) channel. Referring to FIG. 11, it can be observed that each of the CQI information and the AI information meets a received signal quality within transmission energy of about Eb/No=2.7 dB only.

3. Third LTE Applied Embodiment

Basic assumptions of the third embodiment are as follows.
First input data: CQI ($k_1$=9, $n_1$=16)
Second Input data: AI ($k_2$=1, $n_2$=4)
Code $C_1$=(16, 10) coding scheme: Configured by selecting a part from (16, 11) second order Reed Muller code.
Code $C_2$=(5, 1) coding scheme: this can be defined as base of an iterative code.

First of all, a block code generation matrix for $C_1$=(16, 10) is designed. For this, in selecting ten bases except one base from eleven bases of (16, 11) second order RM code, a base having all elements set to 1 is eliminated.

A sub-code $C_{1,1}$=(16, 9) generation matrix is generated by additionally eliminating one base from ten bases of the code $C_1$=(16, 10) generation matrix. In the present embodiment, a sub-code $C_{1,1}$=(16, 9) generation matrix is configured with nine bases resulting from eliminating a bottom base. And, other schemes are applicable according to system situations. A block code generation matrix of the code $C_1$ and the sub-code $C_{1,1}$ obtained from the above process is shown in FIG. 12.

FIG. 12 is a diagram of a block code generation matrix according to a third LTE applied embodiment of the present invention. Bases m[1]~m[10] shown in FIG. 12 are the rest of ten bases except m[11]=[1, 1, ..., 1] from bases of (16, 11) second order RM code. Through the hamming weight distribution interpretation, it can be observed that minimum hamming distances of code $C_1$ and sub-code $C_{1,1}$ can be represented as Formula 16.

$$d_{min}^{(1)}=4, d_{min}^{(1,1)}=4 \qquad [\text{Formula 16}]$$

Figure 13:
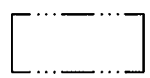
FIG. 13 is a diagram for comparisons of block code generation matrix structures according to LTE applied embodiments of the present invention.
Figure 13:
Figure 13:
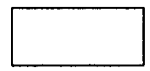
Figure 13:

FIG. 13 is a diagram for comparisons of block code generation matrixes of the code $C_1$ and sub-code $C_{1,1}$ defined according to the first and third LTE applied embodiments of the present invention, respectively. Referring to FIG. 13, each of the first and third LTE applied embodiments is configured with common bases (i.e., portions of (16, 11) second order RM code bases) and can be actually implemented in a single base structure only.

Subsequently, a block code generation matrix of code $C_2$=(4, 1) is designed. In the present embodiment, it is able to define the $C_2$ block coding generation matrix as bases of a simple iterative code like the second LTE applied embodiment.

For instance, if Ack and Nak are represented as 1 and 0 in AI information, respectively, an iterative code of the Ack is [1, 1, 1, 1] and an iterative code of the Nak is [0, 0, 0, 0]. Hence, $d^{(2)}_{min}$=4 and $d_{min}^{(inter)}=d_{min}^{(1)}+d_{min}^{(2)}$=8, $d_{min}^{(intra)}=d_{min}^{(1,1)}$=4.

In the present embodiment, a base is selected as [1, 1, 1, 1].

Subsequently, using the above-generated code $C_1$ generation matrix, the above-generated code $C_2$ generation matrix and the zero matrix, a block code generation matrix of a code C=(20, 10), as shown in FIG. 1a, is designed. Example for a configuration of the generated block code generation matrix is shown in FIG. 14.

FIG. 14 is a diagram of a block code generation matrix according to a third LTE applied embodiment of the present invention. Besides, as mentioned in the above description, the above-generated block code generation matrix can be used in a manner of being rendered into another block code generation matrix by performing inter-row/inter-column permutation to be suitable for a system situation.

Subsequently, by allocating 9-bit CQI information to first input data and allocating 1-bit AI information to second input data, the first input data is provided to a front part and the second input data is provided to a rear part, respectively. Thus, a codeword is generated by combining the first input data and the second input data into one serial sequence using the generated block code generation matrix.

Figure 15:
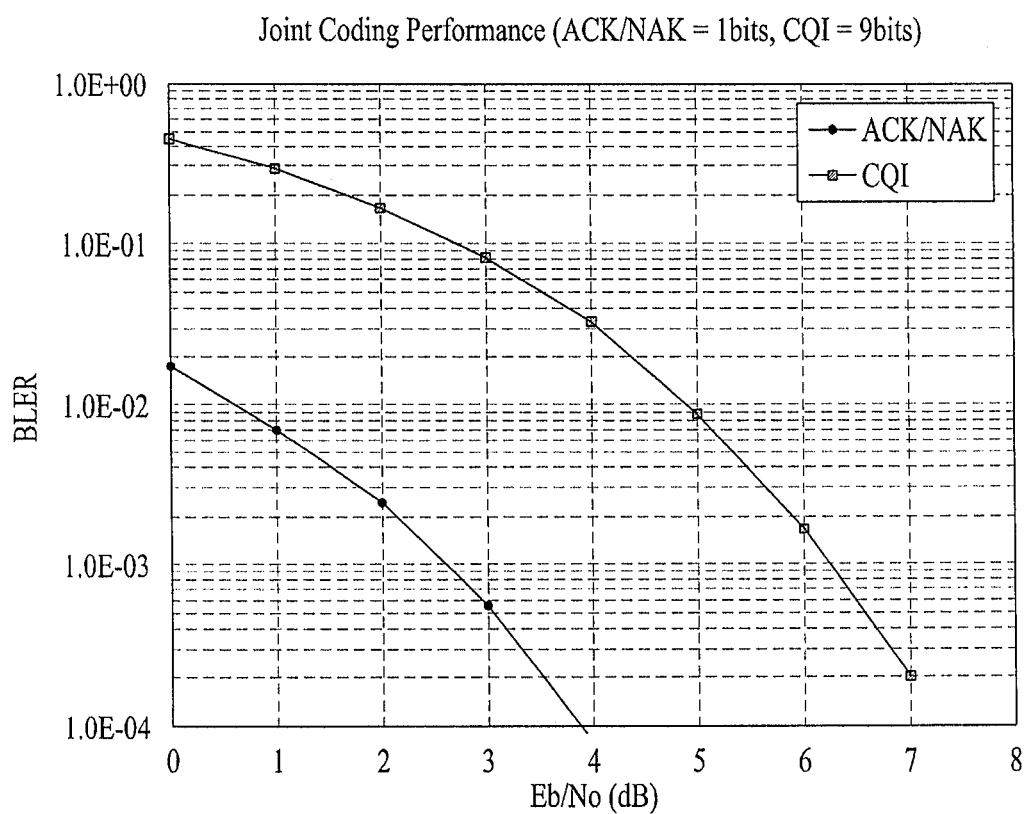
FIG. 15 is a diagram for reception performance in a receiving side if codeword is generated and transmitted on a radio channel according to a third LTE applied embodiment of the present invention.

FIG. 15 is a diagram for reception performance in a receiving side if codeword is generated and transmitted on a radio channel according to a third LTE applied embodiment of the present invention.

In the embodiment shown in FIG. 15, a codeword obtained by joint-coding CQI information (9 bits) and AI information (1 bit) according to the third LTE applied embodiment is transmitted and a receiving side performs ML) maximum likelihood) decoding on the codeword to obtain CQI information and AI information. A block error rate (BLER) of each of the CQI information and the AI information is shown in FIG. 15.

Assume that a modulation scheme is BPSK (binary phase shift keying). Assume that a transport channel is AWGN (additive white Gaussian noise) channel. Referring to FIG. 15, it can be observed that each of the CQI information and the AI information meets a received signal quality within transmission energy of about Eb/No=2.7 dB only. In the above embodiments disclosed in the detailed description of the invention, a generation matrix of second order RM code s used as a block coding matrix. And, other various block coding schemes are available for the embodiments of the present invention as well.

In the above detailed description of the invention, a communication performing process between a transmitting side and a receiving side is mainly explained to help the understanding of the present invention and its embodiments. In this case, the transmitting side can include a terminal or a base station of a network, while the receiving side includes a base station of a network or a terminal. A terminal used in this disclosure can be replaced by one of other terminologies having the same meaning. For instance, 'terminal' can be replaced by such a terminology as a mobile station, a mobile terminal, a communication terminal, a user equipment), a mobile device and the like. And, 'base station' can be replaced by such a terminology as a fixed station, a Node B (NB), an eNode B (eNB) and the like.

While the present invention has been described and illustrated herein with reference to the preferred embodiments thereof, it will be apparent to those skilled in the art that various modifications and variations can be made therein without departing from the spirit and scope of the invention. Thus, it is intended that the present invention covers the modifications and variations of this invention that come within the scope of the appended claims and their equivalents.

INDUSTRIAL APPLICABILITY

Accordingly, embodiments of the present invention are applicable to various radio access systems. For example, the radio access system can include 3GPP (3rd Generation Partnership Project), 3GPP2 and/or IEEE 802.xx (Institute of Electrical and Electronic Engineers 802) system. Moreover, the embodiments of the present invention are applicable to all technical fields having the various radio access systems applied thereto, as well as the various radio access systems.

What is claimed is:

1. In performing block coding on k1-bit first data requiring a received signal quality and k2-bit second data requiring a different received signal quality, a method of joint coding, the method comprising:

configuring a first block code generation matrix meeting a first minimum hamming distance;

configuring a second block code generation matrix meeting a second minimum hamming distance;

configuring a third block code generation matrix including the first block code generation matrix, the second block code generation matrix and a zero matrix having a predetermined size; and coding a serial combination of the first and second data to have an n-bit length using the third block code generation matrix, wherein the first block code generation matrix is divided into a first partial matrix having a third minimum hamming distance equal to or greater than the first minimum hamming distance and a second partial matrix having a fourth minimum hamming distance equal to or greater than the first minimum hamming distance, wherein the third block code generation matrix includes the zero matrix located at a right side of the first partial matrix, and the second block code generation matrix located at a right side of the second partial matrix.

2. The method of claim 1, wherein a last n2 column of the third block code generation matrix is column-permutated with columns of the third block code generation matrix other than the n2 column, and wherein n2 indicates a column size of the second block code generation matrix.

3. The method of claim 1, wherein:

the first data comprises a channel quality indicator (CQI); and the second data comprises an ACK/NACK indicator for acknowledgement of a HARQ process indicator.

4. The method of claim 1, wherein the received signal quality required for the second data is higher than the received signal quality required for the first data.

5. The method of claim 4, wherein in a class corresponding to an exclusive-OR operation set between at least one portion of a first sub-codeword generated from the first data and a first sub-code generation matrix corresponding to a k1 row of the third block code generation matrix and at least one portion of a second sub-codeword generated from the second data and a second sub-code generation matrix corresponding to rows of the third block code generation matrix other than the k1 row, an intra-class minimum hamming distance is smaller than an inter-class minimum hamming distance.

6. The method of claim 4, wherein:

the first data comprises a channel quality indicator (CQI); and the second data comprises an ACK/NACK indicator for acknowledgement of a HARQ process indicator.

* * * * *